(12) United States Patent
Huang et al.

(10) Patent No.: US 9,529,460 B2
(45) Date of Patent: Dec. 27, 2016

(54) PANEL STRUCTURE

(71) Applicant: WINTEK CORPORATION, Taichung (TW)

(72) Inventors: Chun-Ming Huang, Taichung (TW); Yi-Chun Lin, Changhua County (TW); Yi-Chen Tsai, Taichung (TW); Ming-Kung Wu, Taichung (TW)

(73) Assignee: WINTEK CORPORATION, Taichung (TW)

( * ) Notice: Subject to any disclaimer, the term of this patent is extended or adjusted under 35 U.S.C. 154(b) by 108 days.

(21) Appl. No.: 14/340,564

(22) Filed: Jul. 25, 2014

(65) Prior Publication Data
US 2015/0027753 A1    Jan. 29, 2015

(30) Foreign Application Priority Data

Jul. 25, 2013 (TW) .............................. 102126710 A (51) Int. Cl.
| | |
|---|---|
| *H05K 1/09* | (2006.01) |
| *G06F 3/041* | (2006.01) |
| *B32B 23/02* | (2006.01) |
| *H05K 1/02* | (2006.01) |
| *H05K 3/12* | (2006.01) |

(52) U.S. Cl.
CPC ..... *G06F 3/041* (2013.01); *G06F 2203/04103* (2013.01); *H05K 1/0296* (2013.01); *H05K 3/12* (2013.01); *H05K 2201/0326* (2013.01); *H05K 2201/0329* (2013.01); *H05K 2201/09045* (2013.01); *H05K 2201/09154* (2013.01); *H05K 2201/09681* (2013.01); *H05K 2201/09727* (2013.01)

(58) Field of Classification Search
CPC .................... H05K 1/0298; H05K 2201/0191; G06F 3/041; G06F 3/0416; G06F 3/044; G06F 3/045; G02F 1/133512
See application file for complete search history.

(56) References Cited

U.S. PATENT DOCUMENTS

| | | | |
|---|---|---|---|
| 2010/0164881 A1* | 7/2010 | Kuo | G06F 3/044 345/173 |
| 2012/0098551 A1* | 4/2012 | Tsukamoto | G06F 3/044 324/658 |

(Continued)

*Primary Examiner* — Chau N Nguyen
*Assistant Examiner* — Roshn Varghese
(74) *Attorney, Agent, or Firm* — Ming Chow; Sinorica, LLC (57) ABSTRACT

A panel structure includes a substrate, a decoration layer and a conductive component. The decoration layer is located in a first region and the rest region is a second region. The decoration layer includes a middle portion and a first edge protruding portion located between the middle portion and the second region and thinner than the middle portion. Each the conductive component extends in a first direction towards the first region from the second region and crosses the first edge protruding portion followed by extending in a second direction on the middle portion of the decoration layer, the first direction intersects the second direction, each the conductive component on the first edge protruding portion has a first width, each the conductive component on the middle portion extends in the second direction and has a second width less than the first width.

19 Claims, 11 Drawing Sheets

(56) References Cited

U.S. PATENT DOCUMENTS

2012/0113032 A1* 5/2012 Itakura .................... G06F 3/044
                   345/173
2013/0301192 A1* 11/2013 Tang ....................... G06F 3/044
                  361/679.01

* cited by examiner

PANEL STRUCTURE

CROSS-REFERENCE TO RELATED APPLICATION

This application claims the priority benefit of Taiwan application serial no. 102126710, filed on Jul. 25, 2013. The entirety of the above-mentioned patent application is hereby incorporated by reference herein and made a part of this specification.

BACKGROUND OF THE INVENTION

Field of the Invention

The invention generally relates to a panel structure, and more particularly, to a panel structure with a decoration layer.

Description of Related Art

In order to execute various functions such as displaying, touching or sounding in electronic devices, it is often to employ some conductive parts to realize the above-mentioned functions, wherein these conductive parts must connect to a driving chip for operations. In terms of a touch panel, the above-mentioned conductive components can include sensing electrodes and transmission wires. The sensing electrodes herein are configured to mainly provide touch sensing function in an active region, while the transmission wires are disposed in a peripheral region. The sensing electrodes are required to extend to the peripheral region from the active region and then connect to the driving chip through the transmission wires in the peripheral region.

Generally, if the transmission wires in the peripheral region are not shielded, it will affect the overall appearance of the device. Therefore, it usually employs a decoration layer on the peripheral region to shield the transmission wires. However, the decoration layer may form a protruding structure on the peripheral region, and when the conductive components extend to the peripheral region and cover the decoration layer thereabove, the decoration layer may affect the layout of the conductive components, for example, the broken wire phenomenon of the conductive components may occur due to the uneven structure of the decoration layer.

SUMMARY OF THE INVENTION

Accordingly, the invention is directed to a panel structure, wherein a plurality of conductive components can continuously extend to the peripheral region from the active region so as to unlikely cause broken line phenomenon with the conductive components due to the uneven structure of the peripheral region.

The panel structure of the invention includes a substrate, a decoration layer and a plurality of conductive components. The decoration layer is disposed on the substrate, in which a region where the decoration layer is located in is a first region and the region outside the decoration layer is a second region. The decoration layer includes a middle portion and a first edge protruding portion, the thickness of the first edge protruding portion is greater than the thickness of the middle portion, and the first edge protruding portion is located between the middle portion and the second region. Each of the conductive components extends in a first direction towards the first region from the second region and crosses the first edge protruding portion followed by extending in a second direction on the middle portion of the decoration layer, the first direction intersects the second direction, each of the conductive components on the first edge protruding portion has a first width, each of the conductive components on the middle portion, when it extends in the second direction, has a second width, and the first width is greater than the second width.

In an embodiment of the invention, each of the conductive components includes a first conductive pattern and a second conductive pattern, in which the first conductive pattern is at least located in the second region and extends in the first direction and the second conductive pattern includes a transmission section and a connection section. The transmission section is located on the middle portion, extends in the second direction and has the second width, and the connection section is connected between the first conductive pattern and the transmission section. The first conductive pattern of each of the conductive components extends in the first direction from the second region to cover the first edge protruding portion, and the first conductive pattern on the first edge protruding portion has the first width. The connection section has a third width measured in a direction intersecting the first direction, and the third width is greater than the second width. Both the connection section and the first conductive pattern cover the first edge protruding portion. In addition, the panel structure further includes a grounding line and an insulation layer, in which both the grounding line and the second conductive pattern are the same film layer, the grounding line is located between the second conductive pattern and the first edge protruding portion, the insulation layer covers the grounding line and has an opening to expose the connection section of the second conductive pattern, and the first conductive pattern covers the insulation layer and is connected to the connection section through the opening.

In an embodiment of the invention, the connection section of the second conductive pattern extends in the first direction towards the second region from the first region and crosses the first edge protruding portion. The connection section of the second conductive pattern includes a crossing portion crossing the first edge protruding portion and a contacting portion contacting the first conductive pattern, the crossing portion has the first width, the contacting portion has a third width and the third width is greater than the first width.

In an embodiment of the invention, the decoration layer further includes a second edge protruding portion, and the first edge protruding portion and the second edge protruding portion are located at two opposite sides of the middle portion. The panel structure further includes a grounding line covering the second edge protruding portion.

In an embodiment of the invention, the decoration layer includes a first sub decoration layer and a second sub decoration layer, and the first sub decoration layer is located between the second sub decoration layer and the substrate. The first sub decoration layer has a middle portion and at least one edge portion, a first distance between the top surface of the middle portion and the substrate is less than a second distance between the top surface of the edge portion and the substrate, the difference between the first distance and the second distance is ΔH, the thickness of the second sub decoration layer is T and ΔH>T, and the second sub decoration layer is disposed on the middle portion to form the middle portion of the decoration layer. The material of the first sub decoration layer is different from the material of the second sub decoration layer. The first sub decoration layer includes an upper layer, a middle layer and a lower layer, and the middle layer is located between the upper layer and the lower layer. The width of the middle layer is less than the width of the upper layer and the width of the lower layer. The width of the lower layer is greater than the width of the upper layer. Alternately, the widths of the upper layer, the middle layer and the lower layer are sequentially decreased or increased.

In an embodiment of the invention, the material of the decoration layer includes photoresist material, ink, inorganic material or a combination thereof.

Based on the depiction above, in the panel structure of the embodiments of the invention, the conductive components extending onto the decoration layer have sufficient widths, so that even the decoration layer has uneven thicknesses, the conductive components still hardly get broken. Therefore, the panel structure in the embodiments of the invention has ideal quality.

In order to make the features and advantages of the present invention more comprehensible, the present invention is further described in detail in the following with reference to the embodiments and the accompanying drawings.

DESCRIPTION OF THE EMBODIMENTS

Figure 1:
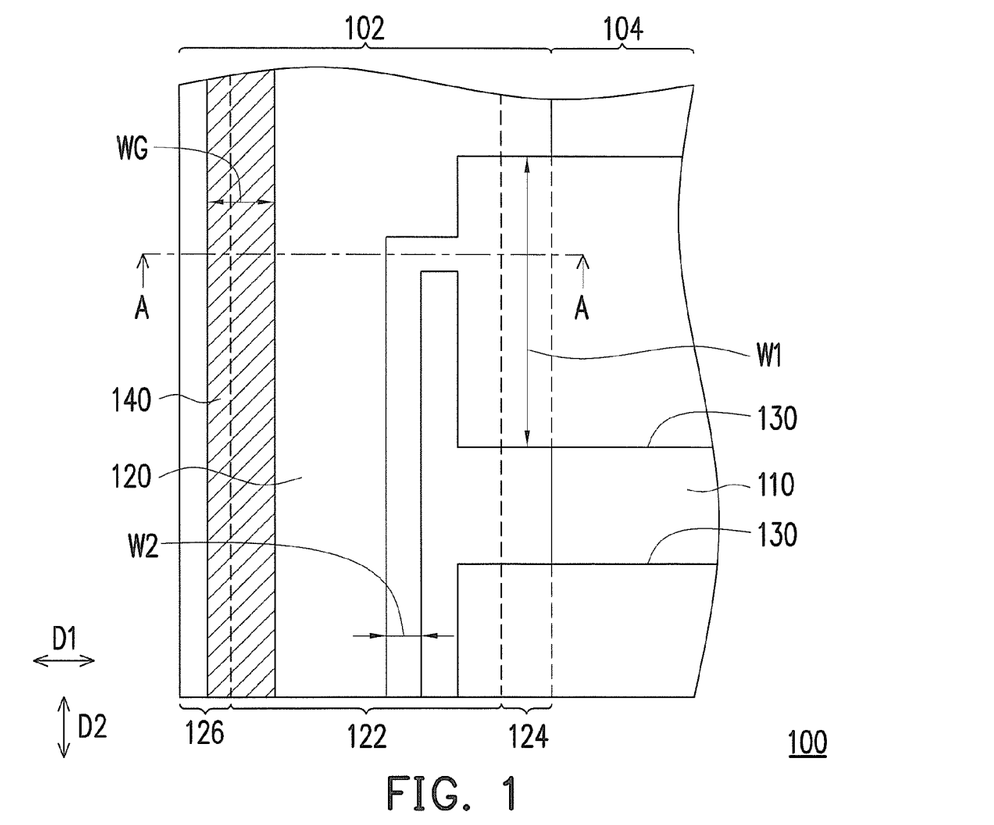
FIG. 1 is a partial top-view diagram of a panel structure according to an embodiment of the invention.
Figure 2:
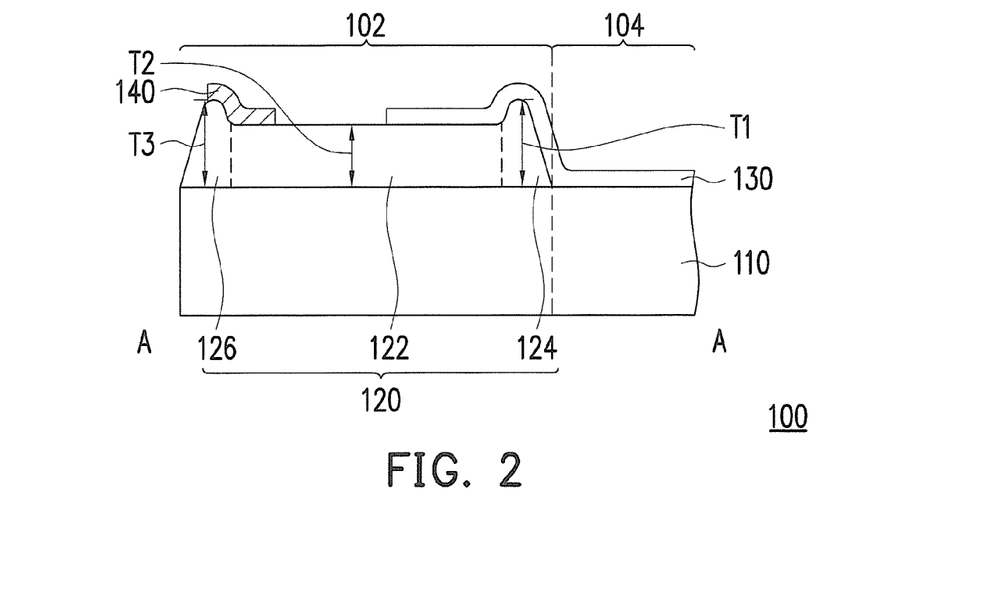
FIG. 2 is a cross-sectional diagram of the panel structure of FIG. 1 along the section line A-A'.

FIG. 1 is a partial top-view diagram of a panel structure according to an embodiment of the invention and FIG. 2 is a cross-sectional diagram of the panel structure of FIG. 1 along the section line A-A'. Referring to FIGS. 1 and 2, a panel structure 100 includes a substrate 110, a decoration layer 120 and a plurality of conductive components 130. In the embodiment, the conductive components 130 are made of conductive material to transmit electrical signals in the panel structure 100 to realize the required functions. As a result, when the conductive components 130 sense a touch sensing signal produced by the touching action of the user, the panel structure 100 serves as a touch panel; when the conductive components 130 are used to drive the display medium for displaying images, the panel structure serves as a driving substrate of the display panel. In short, the term of panel structure used in the specification is applicable to touch sensing purpose, display purpose, driving purpose and so on.

The decoration layer 120 is disposed on the substrate 110, in which the region where the decoration layer 120 is located at is a first region 102 and the rest region without the decoration layer 120 is a second region 104. The decoration layer 120 includes a middle portion 122, a first edge protruding portion 124 and a second edge protruding portion 126. In the embodiment, the first edge protruding portion 124 and the second edge protruding portion 126 are located at opposite two sides of the middle portion 122, and the first edge protruding portion 124 is located between the middle portion 122 and the second region 104. Specifically, the first edge protruding portion 124 and the second edge protruding portion 126 are the structures produced during fabricating the decoration layer 120 in response to the process condition or the material of the decoration layer 120. The thickness T1 of the first edge protruding portion 124 is greater than the thickness T2 of the middle portion 122, and the thickness T3 of the second edge protruding portion 126 is greater than the thickness T2 of the middle portion 122 as well. In other embodiments, due to the difference of the process conditions, the decoration layer 120 may have the first edge protruding portion 124 only or the thickness T1 can be different from the thickness T3.

Each of the conductive components 130 extends in a first direction D1 towards the second region 104 from the first region 102 to cross the first edge protruding portion 124. In more details, each of the conductive components 130, after crossing the first edge protruding portion 124, is bent to extend on the middle portion 122 of the decoration layer 120 in a second direction D2, wherein the first direction D1 intersects the second direction D2, but it is not necessarily a normal intersection. That is, the conductive components 130 may continuously extend in fluctuation with the surface of the decoration layer 120 towards the second region 104 from the first region 102.

Each of the conductive components 130 on the first edge protruding portion 124 has a first width W1, and each of the conductive components 130 extending on the middle portion 122 in the second direction D2 has a second width W2. In general, when the conductive components 130 are fabricated on a rugged surface, the broken line phenomenon may occur due to poor coverage. Especially, the finer the width is, the more likely the broken line phenomenon occurs. Thus, in the embodiment, the first width W1 is greater than the second width W2 by design, which allows the conductive components 130 continuously extend to the first region 102 from the second region 104 without having the broken line phenomenon on the first edge protruding portion 124. It should be noted that the first width W1 means the width of the portion of the conductive component 130 on the first edge protruding portion 124, and the width is measured in a direction perpendicular to the extending direction of the portion. Similarly, the second width W2 means the width of the portion of the conductive component 130 extending in the second direction D2 on the middle portion 122, and the width is measured in a direction perpendicular to the extending direction of the portion.

In the embodiment, if it is necessary to consider the electrostatic protection capability of the panel structure 100, an additional grounding line 140 is employed, and the grounding line 140 can overlap the second edge protruding portion 126. The width WG of the grounding line 140 can be greater than the second width W2, and the grounding line 140 can extend along the second edge protruding portion 126. Especially, when the decoration layer 120 is disposed at the peripheral area surrounding the panel structure 100, the grounding line 140 can also surround the panel structure 100.

The above-mentioned embodiment is to exemplarily describe the layout relationship between the decoration layer 120 and the conductive components 130, not to restrict the invention. For example, in other embodiments, the conductive component 130 can be composed of a plurality of parts. In following, the other layout of the conductive component 130 can be described in examples accompanying with figures, which certainly is for exemplary depiction purpose only, not to limit the invention.

Figure 3:
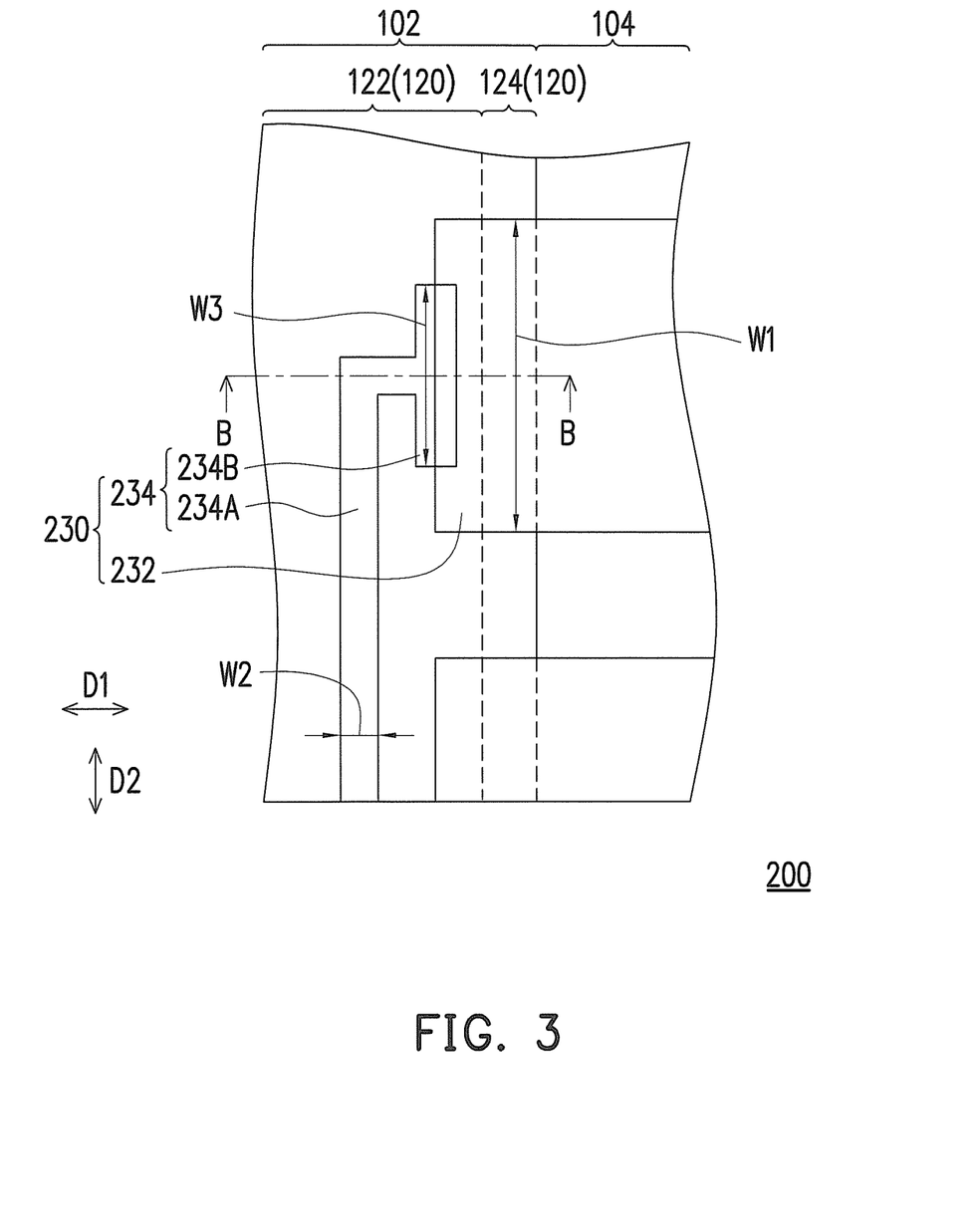
FIG. 3 is a partial top-view diagram of a panel structure according to the second embodiment of the invention.

FIG. 3 is a partial top-view diagram of a panel structure according to the second embodiment of the invention. Referring to FIG. 3, a panel structure 200 is similar to the panel structure 100 so that the same or similar parts in the two embodiments are represented with the same component notations. In more details, the panel structure 200 includes a substrate 110, a decoration layer 120 and a plurality of conductive components 230. Each of the conductive components 230 herein includes a first conductive pattern 232 and a second conductive pattern 234. The first conductive pattern 232 is at least located in the second region 104 and extends in the first direction D1. The second conductive pattern 234 includes a transmission section 234A and a connection section 234B. The transmission section 234A is located on the middle portion 122 of the decoration layer 120 and extends in the second direction D2. The connection section 234B is connected between the first conductive pattern 232 and the transmission section 234A. The materials of the first conductive pattern 232 and the second conductive pattern 234 can be the same or different from each other and include metal, conductive oxide, conductive polymer or other conductive materials. When the panel structure 200 serves as a touch panel, and the materials of the first conductive pattern 232 and the second conductive pattern 234 are the same, the touch panel formed by the panel structure 200 can be a one layer solution type (OLS type) touch panel, which means the first conductive pattern 232 and the second conductive pattern 234 are simultaneously formed in a same film layer. In addition, when the first conductive pattern 232 is required to have sufficient transmittance for the visible light, the first conductive pattern 232 is formed with at least one among the group composed of transparent conductive material, metal and metallic wire in nanometer-grade (e.g., silver nano wire), and the shape thereof can be a continuous film or mesh. Taking metal material as an example, the shape thereof can be metallic mesh or thin metal film, which the invention is not limited to; in addition, it can be a mono layer or a stacked layer by stacking multi-layers, and the stacked layers can be made of a same material or different materials. The material and the shape of the second conductive pattern 234 can be the same as the first conductive pattern 232. Taking metallic mesh as an example, where both the transmission section 234A and the connection section 234B of the second conductive pattern 234 are formed by metallic mesh. In an alternate embodiment, it is allowed to only one of the connection section 234B and the transmission section 234A is formed by the metallic mesh.

In the embodiment, the first conductive pattern 232 of the conductive components 230 extends from the first region 102 in the first direction D1 to cover the first edge protruding portion 124. At the time, the portion of the first conductive pattern 232 on the first edge protruding portion 124 has a first width W1, the transmission section 234A has a second width W2, and the first width W1 is greater than the second width W2. It can be seen from the above-mentioned embodiment, the design that the first width W1 is greater than the second width W2 enables the conductive components 230 continuously extend to the first region 102 from the second region 104 without having broken line risk on the first edge protruding portion 124. In other words, the panel structure 200 has ideal quality.

In addition, the connection section 234B of the second conductive pattern 234 of the embodiment has a third width W3 measured in a direction intersecting the first direction D1, and the third width W3 is greater than the second width W2. The connection section 234B is the section of the second conductive pattern 234 for connecting and contacting the first conductive pattern 232, so that the design that the third width W3 is greater than the second width W2 means the contact area between the second conductive pattern 234 and the first conductive pattern 232 is increased, which helps to establish an electrical connection between the second conductive pattern 234 and the first conductive pattern 232. In other embodiments, the third width W3 can be certainly greater than the first width W1, or the third width W3 can be equal to the first width W1 as well. It should be noted that the first conductive pattern 232 can have the first width W1 at the first region 102 and has other widths different from the first width W1 at the second region 104; for example, the pattern of the first conductive pattern 232 crossing between the first region 102 and the second region 104 can have a triangle shape wherein the base edge of the triangle shape has the first width W1 and the width of the first conductive pattern 232 gets smaller towards the second region 104.

Figure 4:
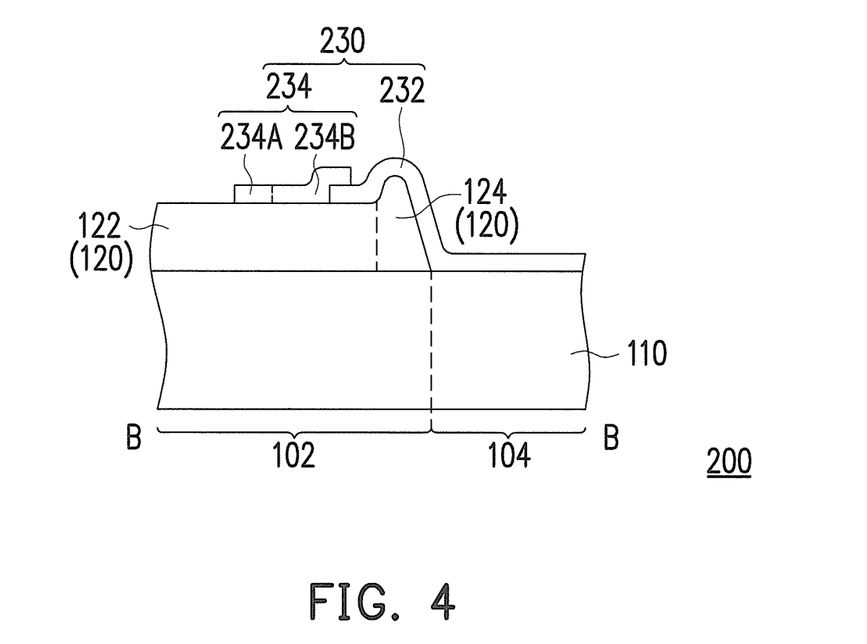
FIG. 4 is a cross-sectional diagram of the panel structure of FIG. 3 along the section line B-B, wherein the first conductive pattern is fabricated first and then, the second conductive pattern is fabricated.

In the embodiment, the sequence of fabricating the first conductive pattern 232 and the second conductive pattern 234 can be adjusted in response to different requirements. At the time, the cross-section structure of the panel structure 200 gets changed according to the different fabricating sequences. FIG. 4 is a cross-sectional diagram of the panel structure of FIG. 3 along the section line B-B, wherein the first conductive pattern is fabricated first and then, the second conductive pattern is fabricated. Referring to FIGS. 3 and 4, when the first conductive pattern 232 is fabricated first and then, the second conductive pattern 234 is fabricated, the first conductive pattern 232 would be continuously distributed along the surface of the decoration layer 120. Meanwhile, the connection section 234B of the second conductive pattern 234 overlaps the end of the first conductive pattern 232, that is, the end of the first conductive pattern 232 is located between the connection section 234B of the second conductive pattern 234 and the decoration layer 120.

Figure 5:
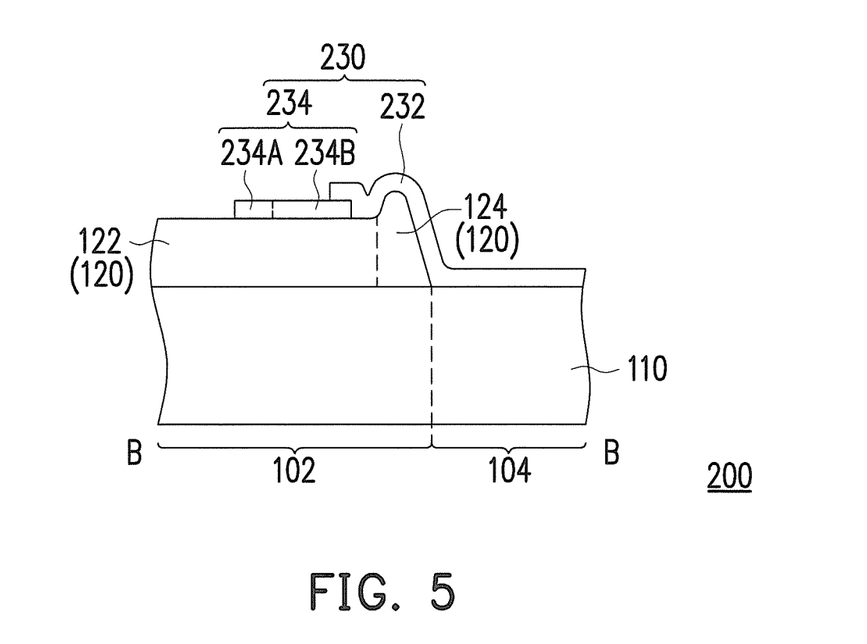
FIG. 5 is a cross-sectional diagram of the panel structure of FIG. 3 along the section line B-B, wherein the second conductive pattern is fabricated first and then, the first conductive pattern is fabricated.

FIG. 5 is a cross-sectional diagram of the panel structure of FIG. 3 along the section line B-B, wherein the second conductive pattern is fabricated first and then, the first conductive pattern is fabricated. Referring to FIGS. 3 and 5, when the second conductive pattern 234 is fabricated first and then, the first conductive pattern 232 is fabricated, the first conductive pattern 232 would be continuously distributed along the surface of the decoration layer 120. Meanwhile, the end of the first conductive pattern 232 would overlap the connection section 234B of the second conductive pattern 234, that is, the connection section 234B of the second conductive pattern 234 is located between the end of the first conductive pattern 232 and the decoration layer 120.

Figure 6:
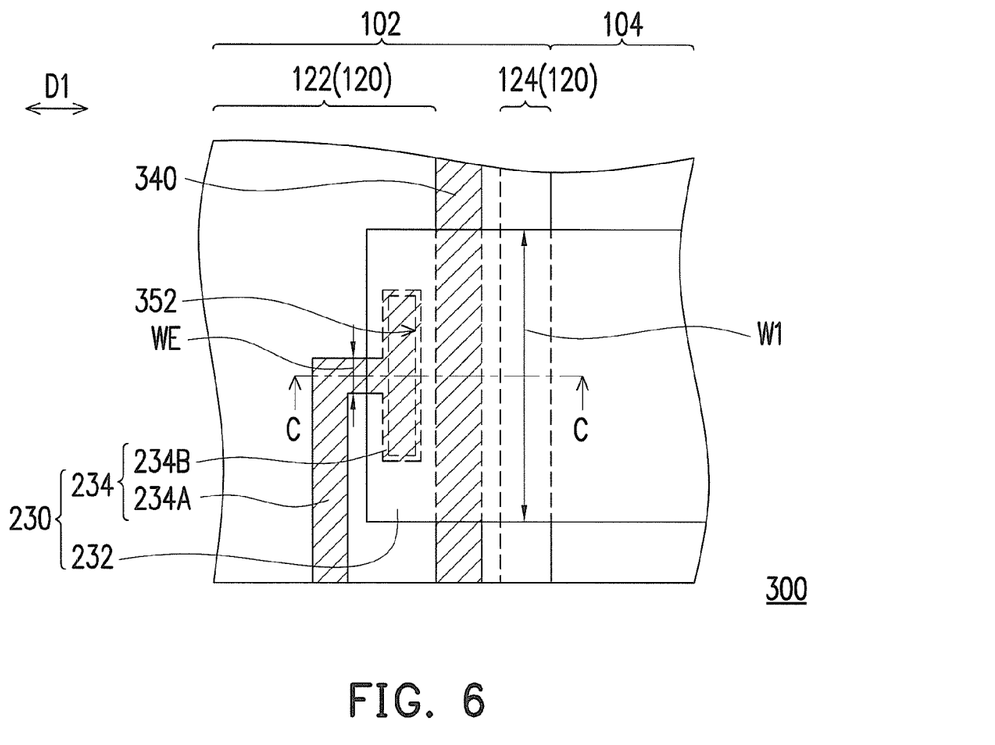
FIG. 6 is a partial top-view diagram of a panel structure according to the third embodiment of the invention.
Figure 7:
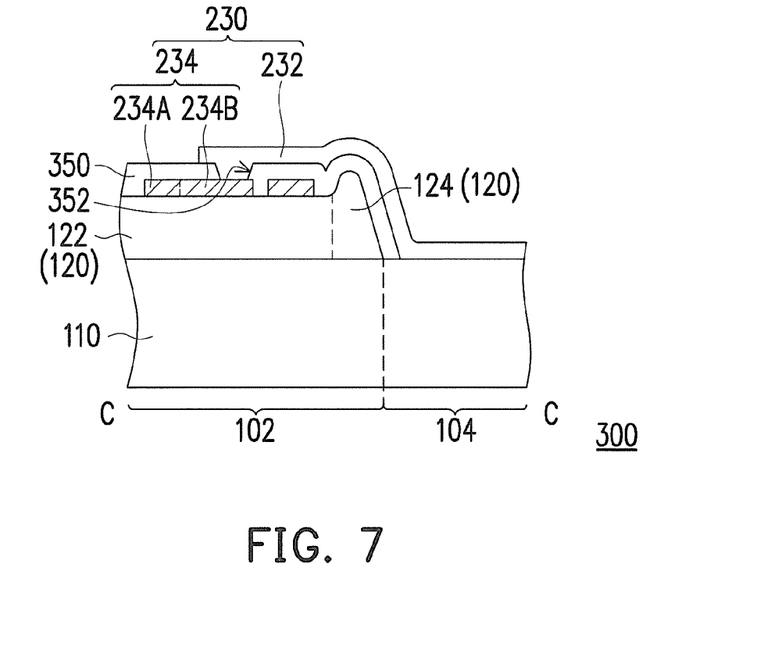
FIG. 7 is a cross-sectional diagram of the panel structure of FIG. 6 along the section line C-C.

In the panel structure 200, the other parts can be fabricated on the film layer where the first conductive pattern 232 and the second conductive pattern 234 are located on. For example, it can refer FIGS. 6 and 7, wherein FIG. 6 is a partial top-view diagram of a panel structure according to the third embodiment of the invention and FIG. 7 is a cross-sectional diagram of the panel structure of FIG. 6 along the section line C-C. The panel structure 300 is similar to the panel structure 200, so that the same or similar parts in the two embodiments are represented with the same component notations. The panel structure 300 includes a grounding line 340 and an insulation layer 350. The grounding line 340 is located between the second conductive pattern 234 of the conductive components 230 and the first edge protruding portion 124 of the decoration layer 120.

In the embodiment, the grounding line 340 and the second conductive pattern 234 are, for example, formed of a same film layer, and the insulation layer 350 covers the grounding line 340 to separate the grounding line 340 from the first conductive pattern 232 of the conductive components 230. In addition, in order to make the first conductive pattern 232 electrically connect to the second conductive pattern 234, the insulation layer 350 has an opening 352 to expose the connection section 234B of the second conductive pattern 234. In this way, although the first conductive pattern 232 covers the grounding line 340, the first conductive pattern 232 can still be connected to the connection section 234B via the opening 352.

In the embodiment, the first conductive pattern 232 of the conductive components 230 extends in the first direction D1 from the second region 104 to cross the first edge protruding portion 124. At the time, the portion of the first conductive pattern 232 on the first edge protruding portion 124 has a first width W1, and the first width W1 can be greater than the width WE of a portion of the transmission section 234A extending towards the connection section 234B so as to avoid the broken line phenomenon caused by the rugged surface of the decoration layer 120 when the first conductive pattern 232 extends towards the first region 102 from the second region 104. In other embodiments however, the first conductive pattern 232 is required to cover a portion of the connection section 234B only.

Figure 8:
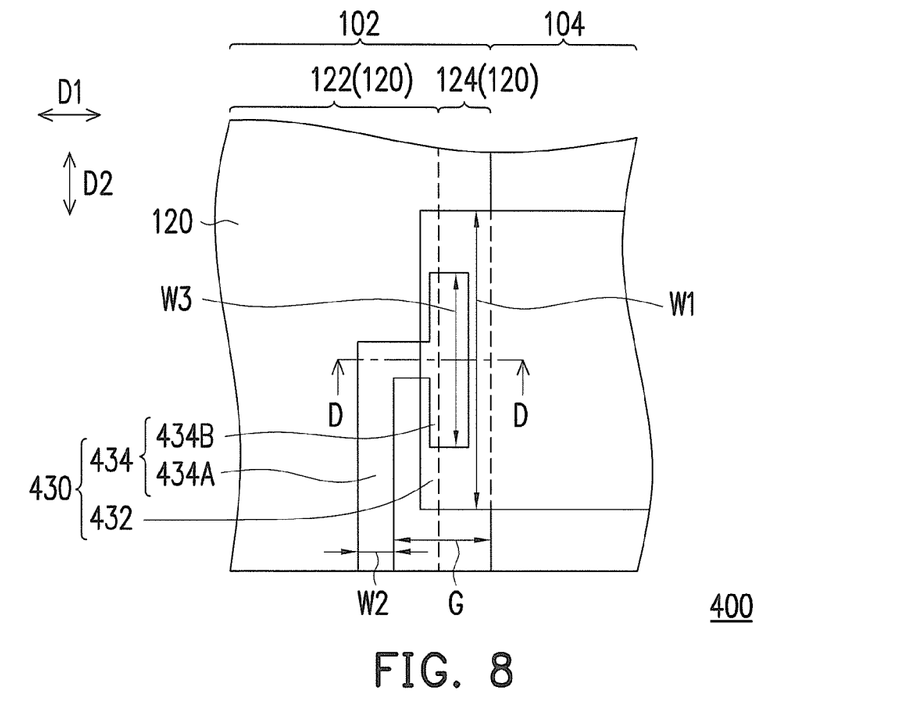
FIG. 8 is a partial top-view diagram of a panel structure according to the fourth embodiment of the invention.
Figure 9:
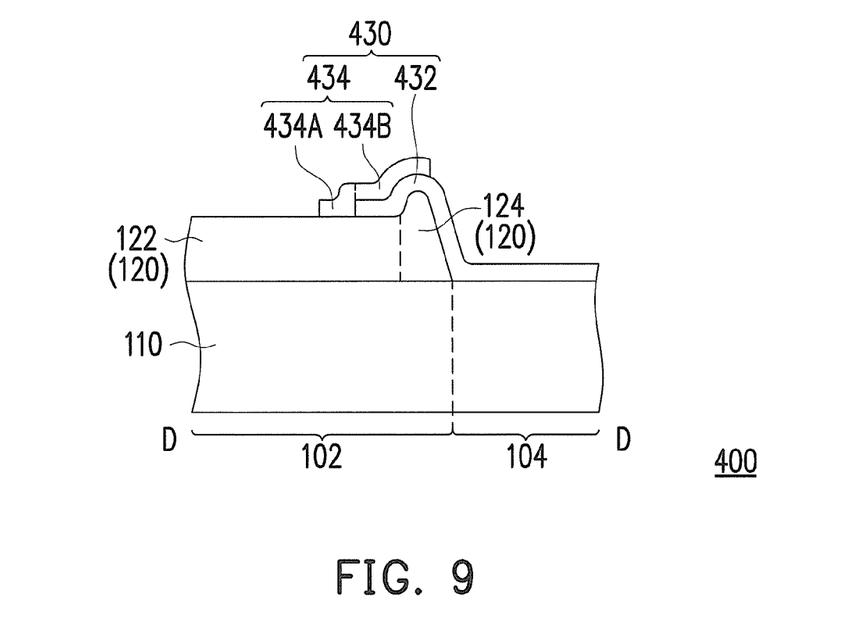
FIG. 9 is a cross-sectional diagram of the panel structure of FIG. 8 along the section line D-D.

FIG. 8 is a partial top-view diagram of a panel structure according to the fourth embodiment of the invention and FIG. 9 is a cross-sectional diagram of the panel structure of FIG. 8 along the section line D-D. Referring to FIG. 8, the panel structure 400 is similar to the panel structure 100 so that the same or similar parts in the two embodiments are represented with the same component notations. The panel structure 400 includes a substrate 110, a decoration layer 120 and a plurality of conductive components 430, in which each of the conductive components 430 includes a first conductive pattern 432 and a second conductive pattern 434. The first conductive pattern 432 is at least located in the second region 104 and extends in the first direction D1. The second conductive pattern 434 includes a transmission section 434A and a connection section 434B. The transmission section 434A is located on the middle portion 122 of the decoration layer 120 and bent to extend in the second direction D2. The connection section 434B is connected between the first conductive pattern 432 and the transmission section 434A.

In addition, the materials of the first conductive pattern 432 and the second conductive pattern 434 can be the same or different from each other, and the materials and the structure designs can be the same as the above-mentioned first conductive pattern 232 and the second conductive pattern 234, which the invention is not limited to.

In the embodiment, the first conductive pattern 432 of the conductive components 430 extends in the first direction D1 from the second region 104 to cover the first edge protruding portion 124. Both the connection section 434B of the second conductive pattern 434 and the first conductive pattern 432 in the embodiment cover the first edge protruding portion 124. At the time, the portion of the first conductive pattern 432 on the first edge protruding portion 124 has a first width W1, the transmission section 434A has a second width W2 and the first width W1 is greater than the second width W2. It can be seen from the above-mentioned embodiment that the design that the first width W1 is greater than the second width W2 enables the conductive components 430 continuously extend to the first region 102 from the second region 104 without having broken line risk on the first edge protruding portion 124. In other words, the panel structure 400 has ideal quality. It should be noted that it is not necessary for the first conductive pattern 432 to entirely overlap the connection section 434B. In other embodiments, the first conductive pattern 432 can partially overlap the connection section 434B, just similar to the overlapping situation depicted in FIG. 3, and such partial overlapping can be realized through that the first conductive pattern 432 gets narrower or inward shift along with the direction directing toward the second region 104 or the connection section 434B gets wider or outward shift along with the direction departing from the second region 104.

In addition, in the embodiment, the connection section 434B of the second conductive pattern 434 has a third width W3 measured in a direction intersecting the first direction D1, and the third width W3 is greater than the second width W2. In other embodiments, the third width W3 can be greater than the first width W1, or the third width W3 can be equal to the first width W1 as well. In other words, the embodiment does not limit the value of the third width W3. In fact, once the width of a portion of the conductive components 430 on the first edge protruding portion 124 is greater than the width of the transmission section 434A, it helps to avoid the broken line phenomenon of the conductive components 430 on the first edge protruding portion 124.

In the embodiment, the connection section 434B of the second conductive pattern 434 is substantially located on the first edge protruding portion 124, which helps to reduce a gap G kept between the transmission section 434A of the second conductive pattern 434 and the boundary of the second region 104, so that when the panel structure 400 has a plurality of transmission sections 434A arranged in the first region 102, the width of the first region 102 can be further decreased along with reducing the gap G to achieve a narrow-border effect.

Figure 10:
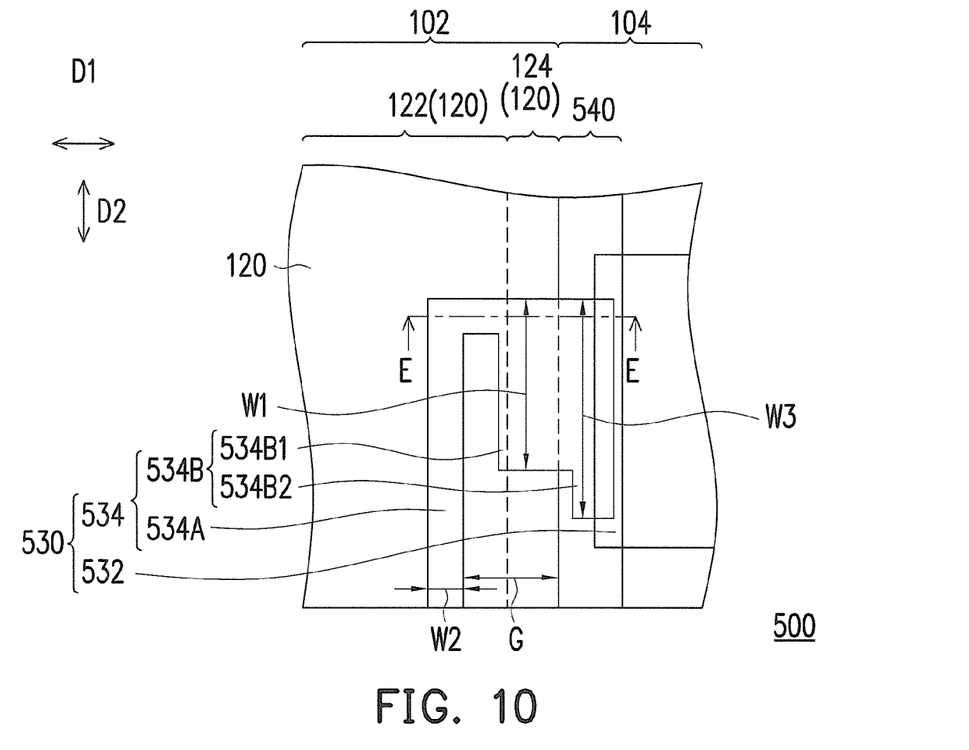
FIG. 10 is a partial top-view diagram of a panel structure according to the fifth embodiment of the invention.
Figure 11A:
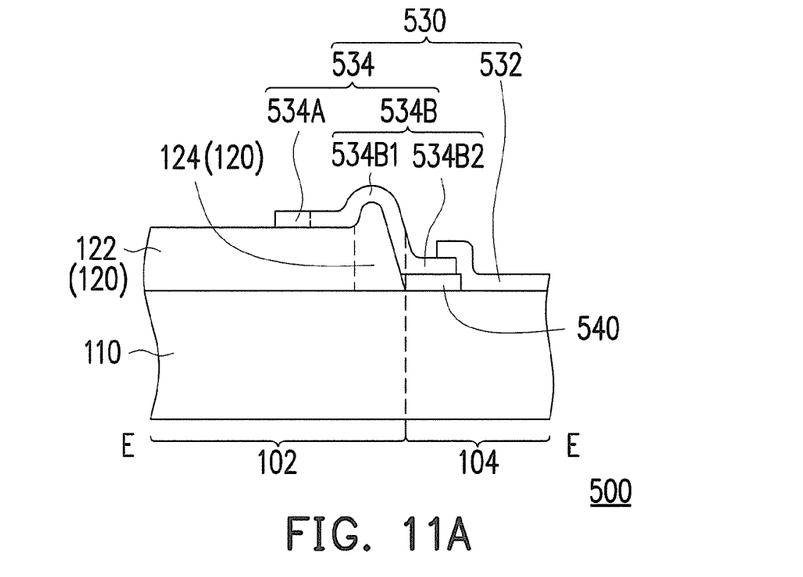
FIG. 11A is a cross-sectional diagram of the panel structure of FIG. 10 along the section line E-E.

FIG. 10 is a partial top-view diagram of a panel structure according to the fifth embodiment of the invention and FIG. 11A is a cross-sectional diagram of the panel structure of FIG. 10 along the section line E-E. Referring to FIGS. 10 and 11A, a panel structure 500 is similar to the panel structure 100 so that the same or similar parts in the two embodiments are represented with the same component notations. The panel structure 500 includes a substrate 110, a decoration layer 120 and a plurality of conductive components 530, in which each of the conductive components 530 includes a first conductive pattern 532 and a second conductive pattern 534. The first conductive pattern 532 is at least located in the second region 104 and extends in the first direction D1. The second conductive pattern 534 includes a transmission section 534A and a connection section 534B. The transmission section 534A is located on the middle portion 122 of the decoration layer 120 and extends in the second direction D2. The connection section 534B is connected between the first conductive pattern 532 and the transmission section 534A.

The first conductive pattern 532 of the conductive components 530 extends in the first direction D1 towards the second region 104 from the first region 102 and crosses over the first edge protruding portion 124. The connection section 534B of the second conductive pattern 534 includes a crossing portion 534B1 crossing over the first edge protruding portion 122 and a contacting portion 534B2 contacting the first conductive pattern 532. In the embodiment, the crossing portion 534B1 is roughly located in the first region 102, while the contacting portion 534B2 is located in the second region 104. When the second conductive pattern 534 is made of metal, the panel structure 500 can further include an inner decoration layer 540 disposed in the second region 104 and adjacent to the decoration layer 120. The material of the inner decoration layer 540 can be, for example, black/dark photoresist material or black/dark ink to shield the portion of the second conductive pattern 534 extending to the second region 104, such as to shield the contacting portion 534B2. In addition, when the decoration layer 120 is formed of a multi-layers structure, the inner decoration layer 540 is able to shield the edge of the decoration layer 120 as well to avoid poor visual effect caused by the uneven multi-layers stacking structure. The inner decoration layer 540 is located between the substrate 110 and the second conductive pattern 534. During the process of the panel structure 500, the inner decoration layer 540 can be fabricated on the substrate 110, followed by fabricating the decoration layer 120 on the substrate 110; or, when the decoration layer 120 is a multi-layers structure, the inner decoration layer 540 can be fabricated together with one of the multi-layers of the decoration layer 120.

Figure 11B:
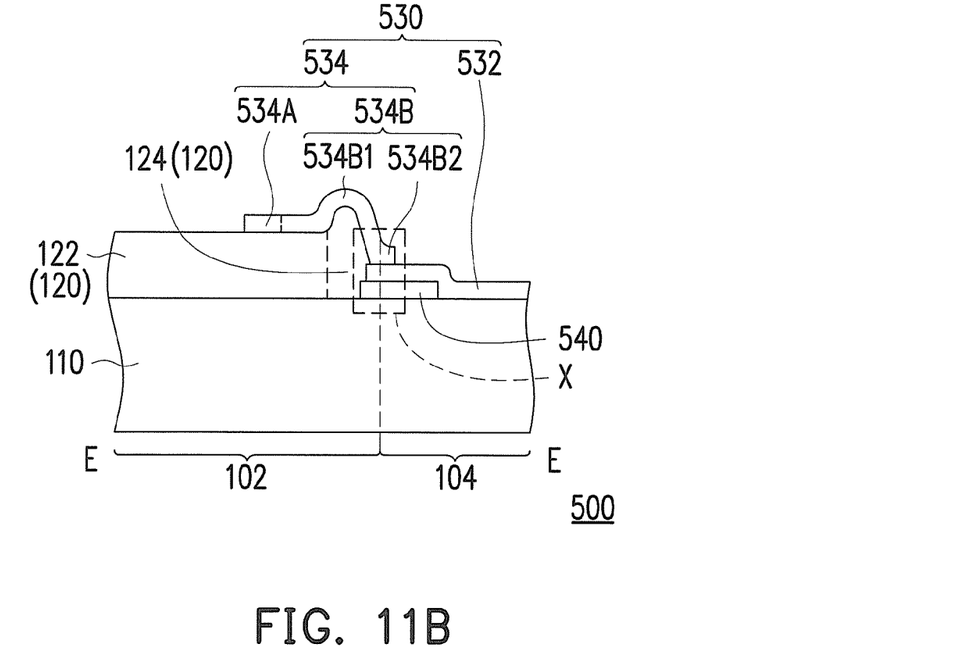
FIG. 11B is a cross-sectional diagram of the panel structure of FIG. 10 with another design along the section line E-E.

FIG. 11B is a cross-sectional diagram of the panel structure of FIG. 10 with another design along the section line E-E. As shown by FIG. 11B, the inner decoration layer 540 can be disposed between the first region 102 and the second region 104 and partially overlapped by the decoration layer 120. One end of the first conductive pattern 532, certainly, can be formed on the inner decoration layer 540 first, followed by fabricating the contacting portion 534B2 of the second conductive pattern 534 covering on the first conductive pattern 532 on the inner decoration layer 540, as shown in the area X in the figure. In other words, the fabrication sequence of the first conductive pattern 532 and the second conductive pattern 534 is not specially defined. In other embodiments, the first conductive pattern 532 can continuously extend towards the first region 102 from the place over the inner decoration layer 540 to cover the decoration layer 120. In this way, the contacting portion 534B2 can be entirely located in the first region 102. It should be noted that the decoration layer 120 is allowed not to cover the first conductive pattern 532 as well.

It can be seen from FIG. 10, the crossing portion 534B1 has a first width W1, and the first width W1 is greater than a second width W2 of the transmission section 534A. The contacting portion 534B2 has a third width W3 and the third width W3 is greater than the first width W1. The design that the first width W1 is greater than the second width W2 in the embodiment allows the conductive components 530 continuously extend between the first region 102 and the second region 104 without easily producing the broken line phenomenon. Meanwhile, the design that the third width W3 is greater than the first width W1 can increase the contacting area between the first conductive pattern 532 and the second conductive pattern 534. As a result, the conductive components 530 can form a continuous conductive path to make the panel structure 500 have ideal quality, which the invention is not limited to. In other embodiments, the third width W3 can be less than the first width W1.

The crossing portion 534B1 of the connection section 534B in the embodiment is substantially located on the first edge protruding portion 124, which is helpful to reduce a gap G kept between the transmission section 534A of the second conductive pattern 534 and the boundary of the second region 104, so that when the panel structure 500 has a plurality of transmission sections 534A arranged in the first region 102, the width of the first region 102 can be further decreased along with reducing the gap G to achieve a narrow-frame effect.

Figure 11C:
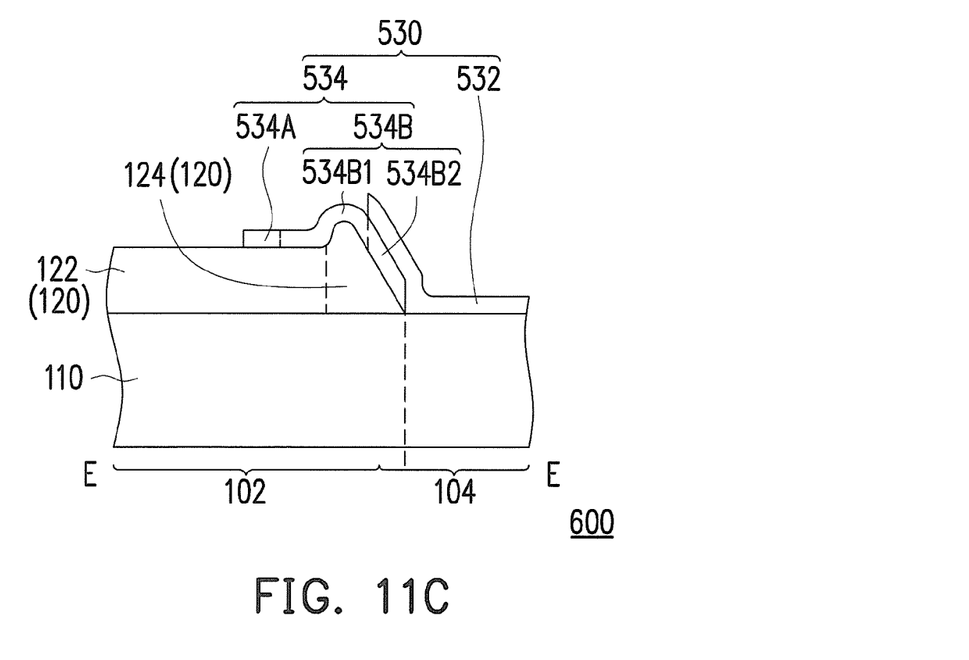
FIG. 11C is a cross-sectional diagram of a panel structure according to the sixth embodiment of the invention.

FIG. 11C is a cross-sectional diagram of a panel structure according to the sixth embodiment of the invention. In FIG. 11C, a panel structure 600 is roughly similar to the above-mentioned panel structure 500 so that the same or similar parts in the two embodiments are represented with the same component notations. The second conductive pattern 534 in the panel structure 600 of the embodiment can be entirely disposed in the first region 102 without additionally employing the inner decoration layer 540 of FIG. 11A, as shown by FIG. 11B. In this way, the second conductive pattern 534 can be entirely shielded by the decoration layer 120 to be unnoticeable for the user. In addition, the first conductive pattern 532 can extend in the first direction D1 to cross the first edge protruding portion 124. In addition, the contacting portion 534B2 is not necessarily to extend to the boundary between the first region 102 and the second region 104; at the time, for example, the contacting portion 534B2 is allowed only to extend beyond the first edge protruding portion 124 a little bit. In addition, the fabricating sequence of the first conductive pattern 532 and the second conductive pattern 534 can be switched.

It should be noted that the invention does not limit all the decoration layers to adopt the above-mentioned design. In fact, once two more conductive components adopt the above-mentioned design, it falls in the scope of the invention already. On the other hand, it allows the first direction of the partial conductive components (not shown) are the same as the second direction without intersection, and such modification principle is also suitable for other components with a plural quantity, which is omitted to describe.

Figure 12:
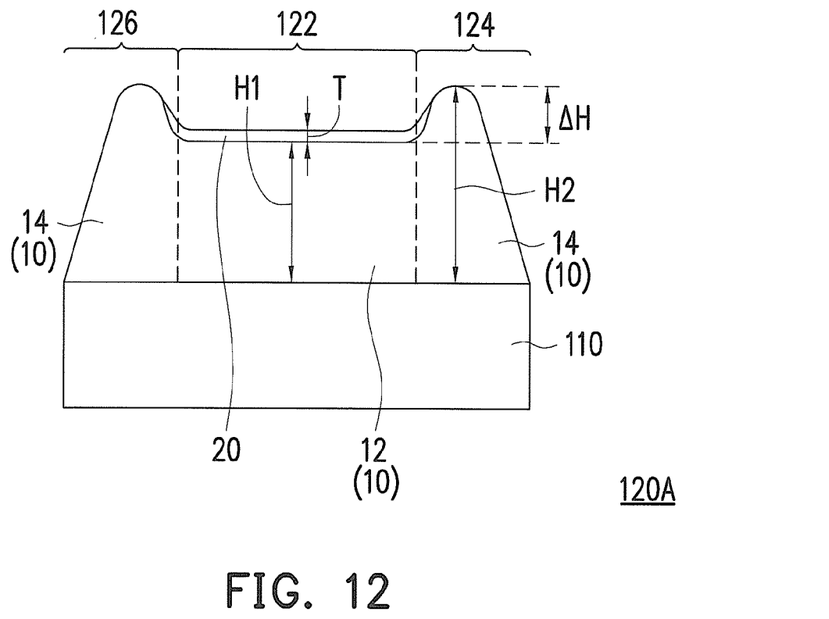
FIGS. 12-17 are cross-sectional structure diagrams of the decoration layer according to multiple embodiments of the invention.

In the above-mentioned embodiments, the material of the decoration layer 120 includes photoresistance, ink, inorganic material or a combination thereof. The actual structure of the decoration layer 120 is various. For example, it can refer FIGS. 12-17 which are cross-section structure diagrams of the decoration layer according to multiple embodiments and these decoration layers are suitable to any one of the above-mentioned embodiments. Referring to FIG. 12 first, a decoration layer 120A includes a first sub decoration layer 10 and a second decoration layer 20. The first sub decoration layer 10 is located between the second decoration layer 20 and the substrate 110. The first sub decoration layer 10 has a middle portion 12 and at least one edge portion 14. A first distance H1 between the top surface of the middle portion 12 and the substrate 110 is less than a second distance H2 between the top surface of the edge portion 14 and the substrate 110. The difference between the first distance H1 and the second distance H2 is ΔH. In addition, the second decoration layer 20 has a thickness T, and ΔH>T. In this way, by disposing the second decoration layer 20 on the middle portion 12, the decoration layer 120A has the middle portion 122, the first edge protruding portion 124 and the second edge protruding portion 126 as the above-mentioned embodiment.

Figure 13:
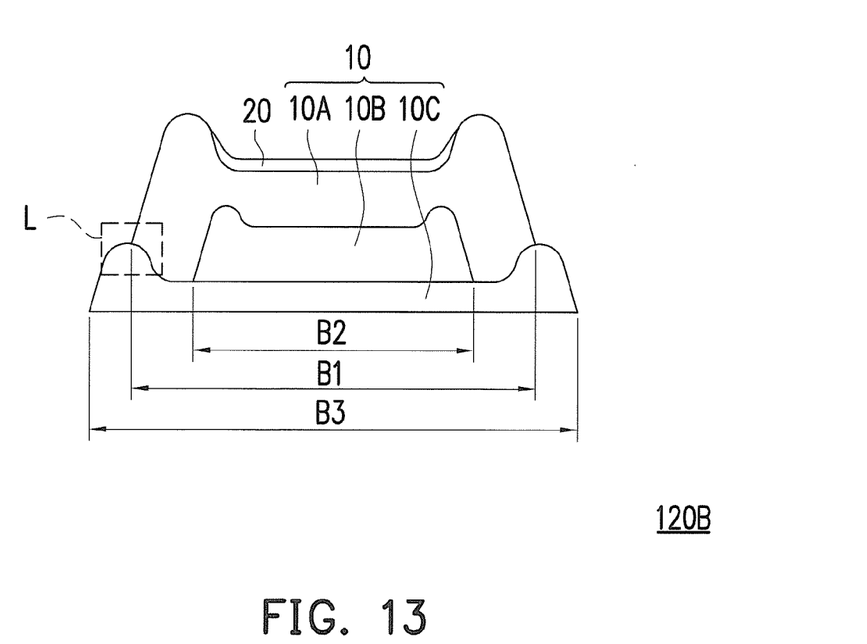

Referring to FIG. 13, the decoration layer 120B includes the first sub decoration layer 10 and the second decoration layer 20, in which the first sub decoration layer 10 is made of white/color ink and the second decoration layer 20 is made of, for example, black/gray photoresist material, which the invention is not limited to. Preferably, the optical density (OD) of the second decoration layer 20 is greater than the OD of the first sub decoration layer 10. The first sub decoration layer 10 is located between the second decoration layer 20 and the substrate 110. The first sub decoration layer 10 includes an upper layer 10A, a middle layer 10B and a lower layer 10C, in which the middle layer 10B is located between the upper layer 10A and the lower layer 10C. The upper layer 10A, the middle layer 10B and the lower layer 10C respectively have width B1, width B2 and width B3, and the width B2 of the middle layer 10B is less than the width B1 of the upper layer 10A and the width B3 of the lower layer 10C. The width B1 of the upper layer 10A is also slightly less than the width B3 of the lower layer 10C so that to form a step structure L between the upper layer 10A and the lower layer 10C. In addition, the edge protruding portion of the lower layer 10C would be partially or entirely exposed, wherein it is better to be exposed partially (as shown by FIG. 13) so that the height of the edge protrusion can be further reduced to facilitate continuously covering the side wall of the decoration layer 120B by the conductive components, which the invention is not limited to. In fact, once the width of the conductive components at the step structure L is greater than the width of the transmission section, the broken line phenomenon can be reduced.

Figure 14:
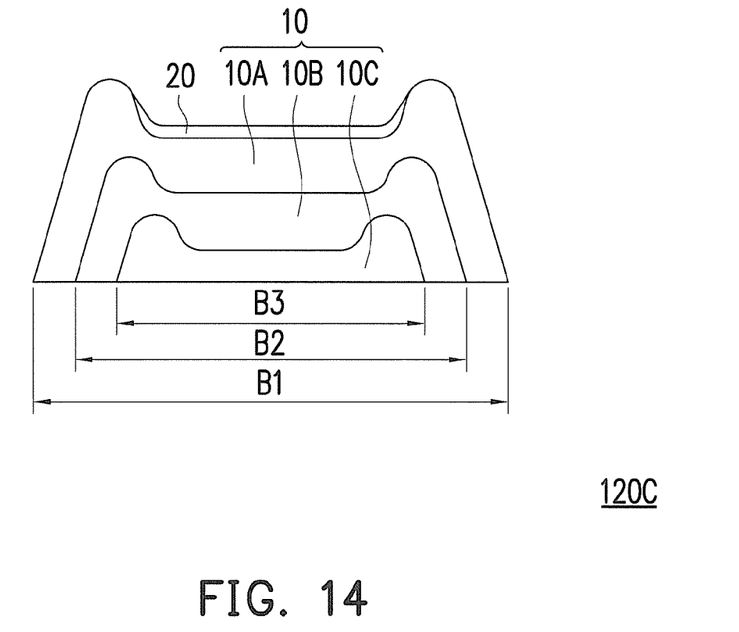
Figure 15:
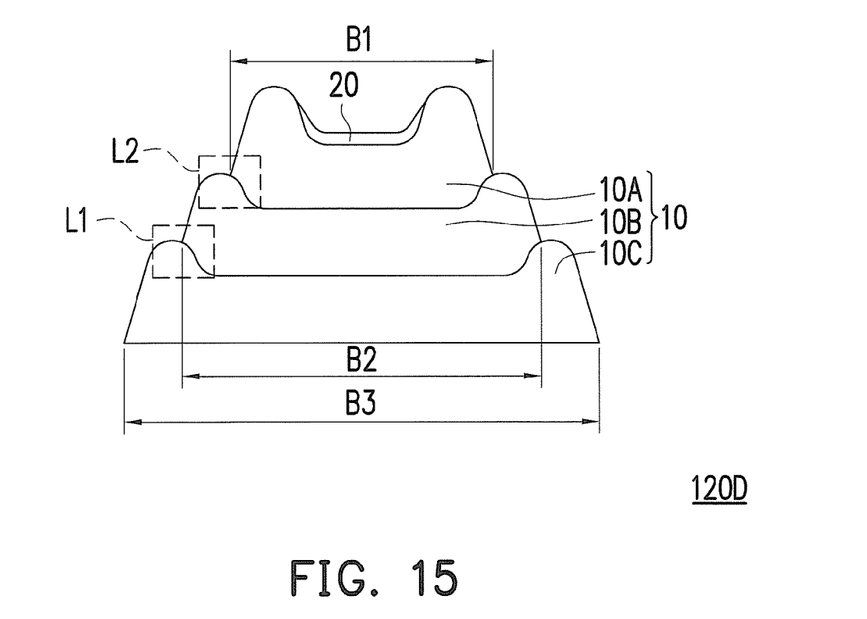

Referring to FIG. 14, the decoration layer 120C is similar to the decoration layer 120B, but the widths B1, B2 and B3 are sequentially reduced. At the time, the lower layer 10C is coated by the middle layer 10B, the middle layer 10B is coated by the upper layer 10A, and the lower layer 10C does not contact the upper layer 10A. Referring to FIG. 15, the decoration layer 120D is similar to the decoration layer 120B, but the widths B1, B2 and B3 are sequentially increased, which forms a step structure L1 between the lower layer 10C and the middle layer 10B. At the time, the edge protruding portion would be partially or entirely exposed. Similarly, another step structure L2 can be formed between the middle layer 10B and the upper layer 10A, and the edge protruding portion of the middle layer 10B would be partially or entirely exposed, wherein it is better to be exposed partially so that the height of the edge protrusion can be further reduced to facilitate continuously covering the side wall of the decoration layer 120D by the conductive components, which the invention is not limited to. In fact, once the width of the conductive components at the above-mentioned step structures L1 and L2 is greater than the width of the transmission section, the broken line phenomenon can be reduced.

Figure 16:
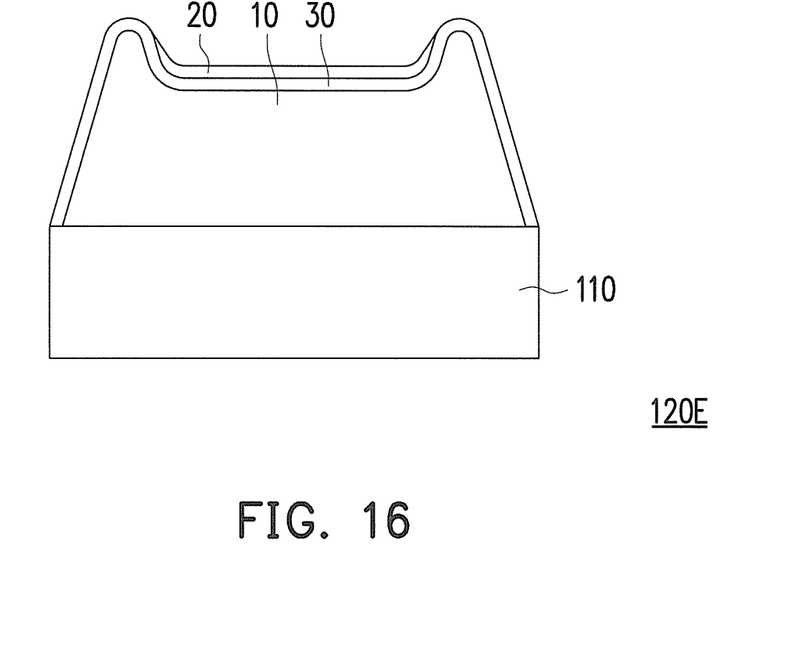

In FIG. 16, the decoration layer 120E includes the first sub decoration layer 10, the second decoration layer 20 and an insulation layer 30, in which the first sub decoration layer 10 is located between the second decoration layer 20 and the substrate 110, and the stacking and the dimensions of the first sub decoration layer 10 and the second decoration layer 20 can, for example, refer to the depictions of FIGS. 13-15, which the invention is not limited to. In addition, the insulation layer 30 can be further disposed between the first sub decoration layer 10 and the second decoration layer 20, and the insulation layer 30 substantially cover the surface of the first sub decoration layer 10 and optionally extend to cover the entire surface of the substrate 110. The insulation layer 30 can further block the interaction between the second decoration layer 20 and the first sub decoration layer 10, for example, can prevent the color-mixing. The insulation layer 30 can adopt, for example, inorganic material and can be an optical matching layer. Further, organic material can also be adopted to cover foresaid inorganic material to form a stacked layer so as to enhance the effect on preventing the color-mixing and the reliability.

Figure 17:
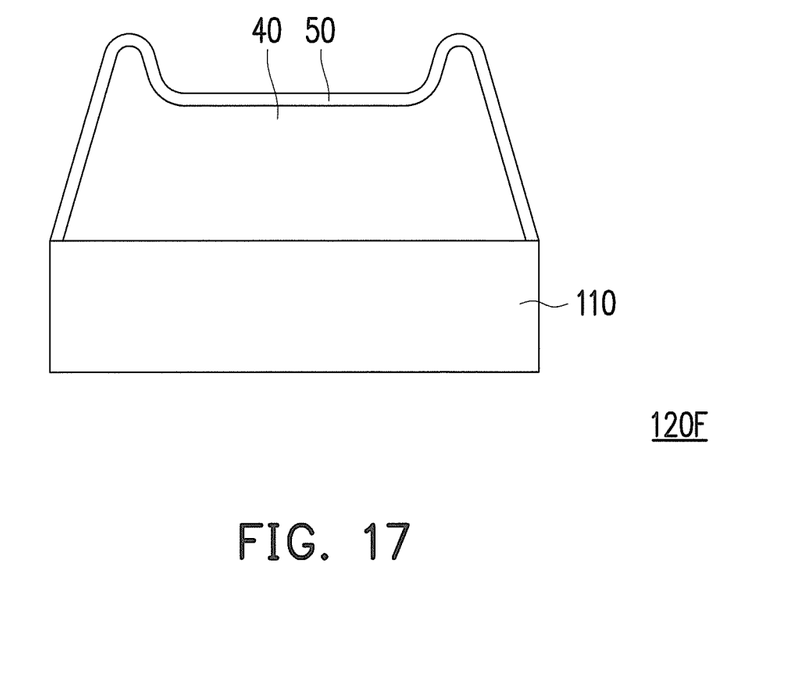

In FIG. 17, the decoration layer 120F includes a decoration layer body 40 and an insulation layer 50, wherein the decoration layer body 40 has the structure design of the above-mentioned decoration layer 120, which is omitted to describe herein. The insulation layer 50 covers the decoration layer body 40, and the decoration layer body 40 is located between the substrate 110 and the insulation layer 50. When the decoration layer 120F is applied in the above-mentioned panel structures 100-600, the insulation layer 50 can improve the product yield of the conductive components. For example, the conductive material formed on the insulation layer 50 during the patterning process is unlikely removed completely to cause a short circuit between the supposedly separated conductive components. Certainly, the insulation layer 50 is not necessary to entirely cover the decoration layer body 40, instead, the insulation layer 50 can cover a portion of the decoration layer body 40, such as the portion extending from the inner edge of the decoration layer body 40 up to cross the first edge protruding portion. In addition, the material of the insulation layer 50 can be, for example, transparent photoresist material.

Figure 18:
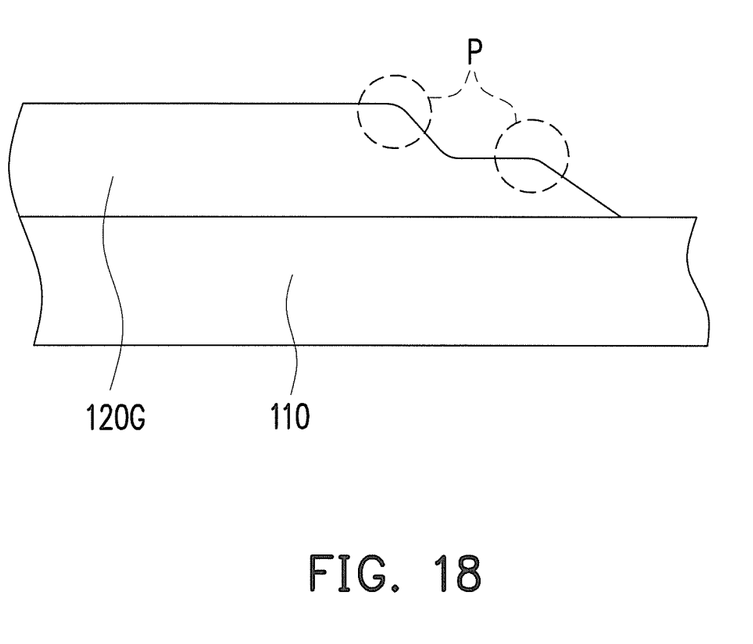
FIG. 18 is a cross-sectional diagram showing a decoration layer and a substrate according to an embodiment of the invention.

The cross-section structures of all the parts in the above-mentioned embodiments and the top-view diagrams are for schematic illustrating purpose only, not following the actual proportions. For example, FIG. 18 is a cross-sectional diagram of a decoration layer and a substrate according to an embodiment of the invention, wherein the decoration layer 120G disposed on the substrate 110 is illustrated to have a noticeable edge protruding portion P, but in fact, the decoration layer 120G substantially has an edge protruding portion P with a slight protrusion not so noticeable as the schematic diagram.

In summary, in the panel structure of the embodiments of the invention, the conductive components extending onto the decoration layer have sufficient widths, so that even the decoration layer has uneven thicknesses, the conductive components still hardly get broken. Therefore, the panel structure in the embodiments of the invention has ideal quality.

What is claimed is:
1. A panel structure, comprising:
a substrate;
a decoration layer, disposed on the substrate, wherein a region where the decoration layer is located in is a first region and a region outside the decoration layer is a second region, the decoration layer comprises a middle portion and a first edge protruding portion, the thickness of the first edge protruding portion is greater than the thickness of the middle portion, and the first edge protruding portion is located between the middle portion and the second region; and a plurality of conductive components, wherein each of the conductive components extends in a first direction towards the first region from the second region and crosses over the first edge protruding portion, and each of the conductive components extends in a second direction on the middle portion of the decoration layer, wherein the first direction intersects the second direction, wherein each of the conductive components on the first edge protruding portion has a first width, each of the conductive components extending in the second direction on the middle portion has a second width, and the first width is greater than the second width, and wherein each of the conductive components comprises:
    a first conductive pattern, at least located in the second region and extending in the first direction; and
    a second conductive pattern, comprising a transmission section and a connection section, wherein the transmission section is located on the middle portion, extending in the second direction and having the second width, and the connection section is connected between the first conductive pattern and the transmission section,
    wherein the first conductive pattern of each of the conductive components extends in the first direction from the second region to cover the first edge protruding portion, and the first conductive pattern on the first edge protruding portion has the first width.

2. The panel structure as claimed in claim .1, wherein the connection section has a third width measured in a direction intersecting the first direction, and the third width is greater than the second width.

3. The panel structure as claimed in claim 1, wherein both the connection section and the first conductive pattern cover the first edge protruding portion.

4. The panel structure as claimed in claim 1, further comprising a grounding line and an insulation layer, wherein both the grounding line and the second conductive pattern belong to a same film layer, the grounding line is located between the second conductive pattern and the first edge protruding portion, the insulation layer covers the grounding line and has an opening to expose the connection section of the second conductive pattern, and the first conductive pattern covers the insulation layer and is connected to the connection section through the opening.

5. The panel structure as claimed in claim 1, wherein the connection section of the second conductive pattern extends in the first direction towards the second region from the first region and crosses over the first edge protruding portion.

6. The panel structure as claimed in claim 5, wherein the connection section of the second conductive pattern comprises a crossing portion crossing the first edge protruding portion and a contacting portion contacting the first conductive pattern, the crossing portion has the first width, the contacting portion has a third width and the third width is greater than the first width.

7. The panel structure as claimed in claim 1, wherein the decoration layer further comprises a second edge protruding portion, and the first edge protruding portion and the second edge protruding portion are located at opposite two sides of the middle portion.

8. The panel structure as claimed in claim 7, further comprising a grounding line covering the second edge protruding portion.

9. The panel structure as claimed in claim 1, wherein the decoration layer comprises a first sub decoration layer and a second sub decoration layer, and the first sub decoration layer is located between the second sub decoration layer and the substrate.

10. The panel structure as claimed in claim 9, wherein the decoration layer comprises an insulation layer, and the insulation layer is disposed between the first sub decoration layer and the second sub decoration layer.

11. The panel structure as claimed in claim 9, wherein the first sub decoration layer has a middle portion and at least one edge portion, a first distance between a top surface of the middle portion and the substrate is less than a second distance between a top surface of the edge portion and the substrate, the difference between the first distance and the second distance is $\Delta H$, thickness of the second sub decoration layer is T and $\Delta H > T$, and the second sub decoration layer is disposed on the middle portion to form the middle portion of the decoration layer.

12. The panel structure as claimed in claim 9, wherein an optical density of the second sub decoration layer is greater than an optical density of the first sub decoration layer.

13. The panel structure as claimed in claim 9, wherein the first sub decoration layer comprises an upper layer, a middle layer and a lower layer, and the middle layer is located between the upper layer and the lower layer.

14. The panel structure as claimed in claim 13, wherein the width of the middle layer is less than the width of the upper layer and the width of the lower layer.

15. The panel structure as claimed in claim 13, wherein the width of the lower layer is greater than the width of the upper layer.

16. The panel structure as claimed in claim 13, wherein the widths of the upper layer, the middle layer and the lower layer are sequentially increased.

17. The panel structure as claimed in claim 13, wherein the widths of the upper layer, the middle layer and the lower layer are sequentially decreased.

18. The panel structure as claimed in claim 1, wherein the first conductive pattern is a metallic mesh or a metallic wire in nanometer-grade.

19. The panel structure as claimed in claim 1, wherein the decoration layer comprises a decoration layer body and an insulation layer, and the insulation layer extends towards the first region from the second region and crosses the first edge protruding portion.

\* \* \* \* \*